April 28, 1970 J. R. KUBIK 3,508,330

METHOD OF FABRICATING MULTITUBE ELECTRONIC CIRCUIT BOARDS

Filed April 6, 1967

INVENTOR.

JAMES R. KUBIK,

By L. E. Carnahan

AGENT.

United States Patent Office 3,508,330
Patented Apr. 28, 1970

3,508,330

METHOD OF FABRICATING MULTITUBE ELECTRONIC CIRCUIT BOARDS

James R. Kubik, Upland, Calif., assignor to General Dynamics Corporation, a corporation of Delaware Filed Apr. 6, 1967, Ser. No. 629,001
Int. Cl. H01r *43/00;* H05k
U.S. Cl. 29—628 4 Claims

ABSTRACT OF THE DISCLOSURE

The disclosure relates to a method of making integral conductor paths and through-hole tubes in multilayer positioner boards on which components are to be mounted, the through-hole tubes extending outwardly in opposite directions from the plane of the positioner board. According to this method, temporary backing material is applied to each side of various layers of material which make up the multilayer positioner board in a desired sequence such that when the thus assembled layers of material are bonded together, the bonded assembly is prepared for the drilling, plating and finishing procedures which produce the end item.

Background of the invention

This invention relates to electrical connectors, particularly to processes for the fabrication of high density multilayer electrical interconnects for interconnecting various elements of the multilayer circuits, and more particularly to a process for fabricating such interconnects which allow component and lead attachment to both sides of the board.

Devices which serve as a media for attaching electronic components to a circuit in single or multilayer apparatus, such as 3–D module construction, are known. The end result of such devices is a series of circuits on at least one positioner or carrier board with tube-like elements at appropriate places in continuity with these circuits. The function of these tube-like elements is to receive electronic component leads so that they may be connected to the circuit as used in module construction, for example, U.S. Patent No. 3,209,066 exemplifying such known devices.

Related applications

The present invention is an improvement of the manufacturing methods described and claimed in U.S. Patent applications Ser. Nos. 413,689, now Patent No. 3,396,-459, and 589,039, and assigned to the same assignee.

Summary of the invention

The present invention has for its purpose an improved method of fabricating multilayer circuit board substrates incorporating high density tube-like elements utilized in welded or soldered high density electronic modules or the like. The distinct advantages of multitube circuit boards made in accordance with this invention are: (1) it lends itself to higher density packaging, (2) it is more versatile, allowing component and lead attachment to both sides of the board, and (3) it advances other concepts for multilayer applications.

The multitubes are fabricated by electroforming techniques after certain basic substrate manufacturing steps are completed. Composition of the multitube can be nickel, tin/nickel, copper, or any metal whose electro deposition is compatible and will produce the desired end product. The formation of the multitube is not limited to monometal deposition techniques, since poly-metal deposition (i.e., use of several metals) to fabricate the multitube is both feasible and desirous for certain applications or engineering needs.

Therefore, it is an object of this invention to provide a method of fabricating circuit boards having high density tube-like elements formed therein.

A further object of the invention is to provide a process for fabricating a multilayer circuit board substrate with internal circuits.

Another object of the invention is to provide a method of fabricating multilayer circuit boards with multitubes molecularly integral with at least certain of the circuits therein.

Another object of the invention is to provide a method of manufacturing tube-like elements molecularly integral with circuits of a multilayer circuit board such that the tube-like elements extend outwardly from opposite surfaces of the circuit board.

Other objects of the invention, not specifically set forth above, will become readily apparent from the following description and accompanying drawings wherein:

Description of the invention

Figure 1:
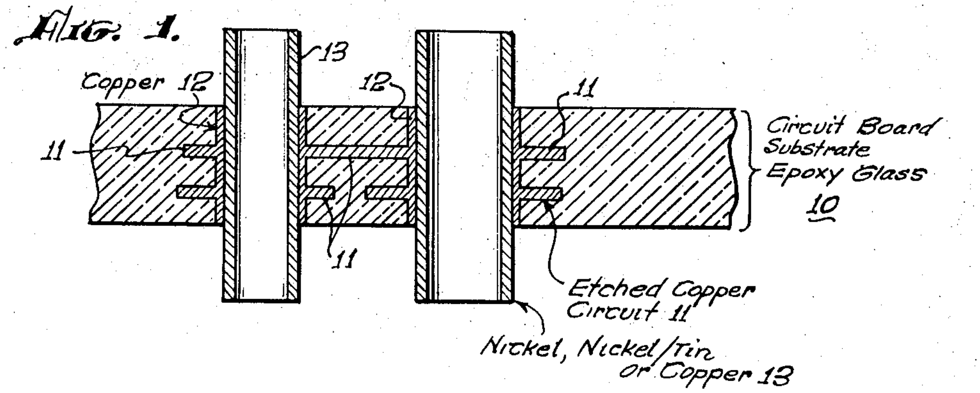
FIG. 1 is a cross sectional view of an embodiment of a multilayer circuit board made in accordance with the invention.

The embodiment of the multilayer multitube circuit board assembly comprises a circuit carrier or positioner board 10 constructed from epoxy glass or equivalent material, which is provided with a plurality of etched copper circuits 11 molecularly integral with copper plating 12 extending through the carrier board 10, copper plating 12 being molecularly integral with tubular members 13 which extend from both surfaces of carrier board 10 a sufficient distance to allow welder electrodes to be positioned thereabout for connecting the tubular members 13 to component leads or the like on both sides of the board 10. As illustrated in FIG. 1, the tubular members 13 may be of different diameters to accommodate various sizes of component leads. For example, the member 13 shown at the right side of FIG. 1 may be 0.060 inch outside diameter while the member shown at the left side has an 0.025 inch outside diameter, each of the members 13 having a wall thickness of from 0.0015 inch to 0.006 inch and extending 0.020 inch to 0.050 inch outwardly from the surfaces of the circuit board 10. The tubular members 13 may be constructed, for example, of nickel, nickel/tin, or copper, depending on the application requirements.

Figure 2:
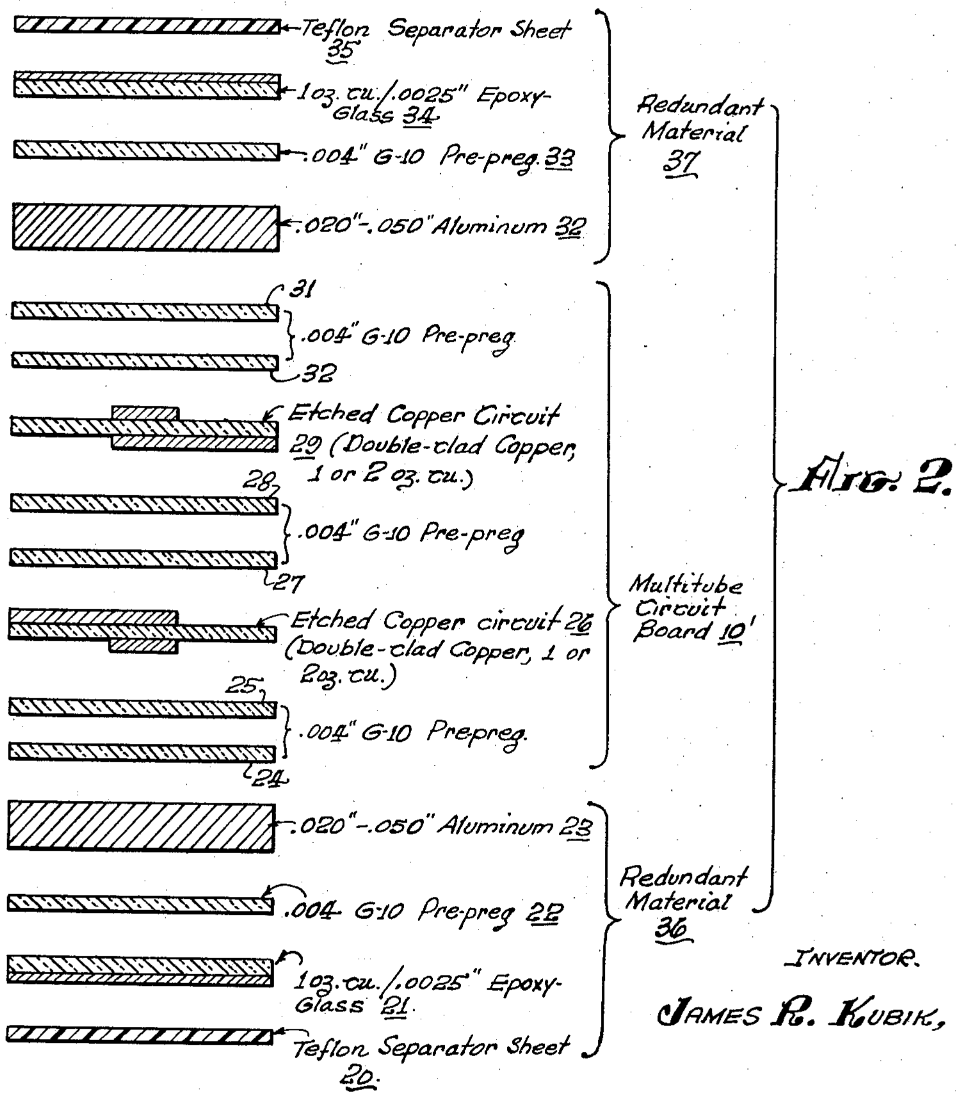
FIG. 2 is an exploded view of the various layers of material in the initial laminated assembly utilized to produce the FIG. 1 embodiment.

The lamination process for producing the multilayer circuit board with molecularly integral circuits and tubular members similar to that shown in FIG. 1 is set forth as follows with reference to FIG. 2:

(1) Using conventional lamination tooling (not shown), place separator material such as Teflon sheet 20 first in position on the tooling bottom plate.

(2) Place a 2.5 mil epoxy-glass, 1 ounce copper one-sided laminate 21 with the copper side down on separator sheet 20.

(3) Add a 4 mil epoxy-glass prepreg sheet 22 on top of laminate 21.

(4) Position a chemically cleaned 0.020 inch to 0.050 inch type 7075–T6 aluminum sheet 23 on prepreg 22, the thickness of sheet 23 being the same as the desired height of the lower portion of tubular members 13 of FIG. 1.

(5) Add two 4 mil prepreg sheets 24 and 25 on aluminum sheet 23.

(6) Position a double copper clad epoxy-glass laminate 26 on top of prepreg sheet 25, the copper clad being of a 1 or 2 ounce variety and etched to define the desired configuration of the lower circuits 11.

(7) Add two 4 mil prepreg sheets 27 and 28 on laminate 26.

(8) Position a double copper clad epoxy-glass laminate 29 on top of prepreg sheet 28, again the copper cladding being of the type similar to laminate 26 and the copper etched to define the desired configuration of the upper circuits 11.

(9) Add two 4 mil prepreg sheets 30 and 31 on laminate 29.

(10) Position a chemically cleaned 0.020 inch to 0.050 inch type 7075–T6 aluminum sheet 32 on prepreg 31, the thickness of sheet 32 being the same as the desired height of the upper portion of tubular members 13 of FIG. 1.

(11) Add a 4 mil epoxy-glass prepreg sheet 33 on top of aluminum sheet 32.

(12) Place a 2.5 mil epoxy-glass, 1 ounce copper one-sided laminate 34 with the copper side up on prepreg sheet 33.

(13) Position a separator paper such as Teflon sheet 35 on laminate 34.

(14) Place lamination tooling top plate (not shown) in position on Teflon sheet 35 and insert entire assembly in a heated hydraulic press (not shown) which is maintained at 350° F.±5° F.

(15) Heat assembly for 1 to 4 minutes at 350° F. and 10 p.s.i.

(16) Increase pressure on press to 300±10 p.s.i. and hold for one-half hour.

(17) Cool laminate under pressure to approximately 150° F.

(18) Remove bonded assembly from lamination tooling, remove the separator material, and trim away any adhesive flash.

The remainder of the processing can be accomplished by various techniques, as illustrated by the above exemplified copending applications; the particular technique utilized will depend on the requirements for the end product and the type of material of which the tubular member is composed.

The following procedure illustrates a technique for producing the molecularly integral tubular members of the multilayer circuit board illustrated in FIG. 1. Note that in FIG. 2 the layers of material generally indicated at 36 and 37 are redundant material layers and will be removed during the finalizing sequence described hereinafter; while the layers of material generally indicated at 10′ are bonded together to form the carrier or positioner board of the end item with the circuits 11 and tubular members 13 integrally connected therein.

With the material layers 20–35 bonded together as described above with respect to FIG. 2, the bonded assembly is then operated on, for example, in the following sequence:

(1) Drill holes of appropriate size (approproximately 0.012 inch larger than the inside diameter of the desired tubular member 13) through the bonded assembly at those places requiring a member 13 in the circuit. Clean the thus drilled holes.

(2) Electro-copper plate the exposed aluminum surfaces of sheets 23 and 32 in the drilled holes by a pyrophosphate process to a thickness of approxiamtely 0.0006 inch.

(3) Sensitize the exposed plastic surfaces (the surfaces of the holes in epoxy-glass layers 21, 26, 29 and 34 and in prepreg sheets 22, 24, 25, 27, 28, 30, 31 and 33) by immersion in a suitable conventionally known catalyst.

(4) Electroless copper plate all sensitized surfaces of the holes described above in step 3, the exposed copper surfaces of the holes in aluminum layers 23 and 32, and the exposed surfaces of the holes in the circuit paths 11 of layers 26 and 29, and the copper surfaces of layers 21 and 34, to a thickness of about 0.0001 inch.

(5) Electro-copper plate all exposed copper surfaces to define the copper layer 12 (see FIG. 1) to a total thickness of about 0.0015 to 0.002 inch.

(6) Electro-nickel plate (sulfamate) all exposed copper surfaces to define a nickel layer having the desired thickness of the walls of the tubular members 13 which may, for example, be about 0.0015 to 0.006 inch.

(7) Remove the laminates 21 and 34 with the material plated thereto and the prepreg layers 22 and 33 to expose the aluminum sheets 23 and 32. This may be accomplished, for example, by sanding. Remove burrs from the exposed surface and from the ends of the tubular member walls.

(8) Dissolve aluminum layer 23 and 32 by immersing in a concentrated alkali solution leaving end portions of the tubular members extending from the bonded layers 24–31 (circuit board 10′).

(9) Remove exposed portion of copper layers 12 from the wall surface of the tubular members 13 by a conventional copper stripping procedure, such as by immersing in a copper stripper.

The above process produces the final produce comprising tubular members 13, constructed essentially of nickel and molecularly integral with at least certain of circuits 11 via the copper layer 12 and secured to insulation board 10, said tubular members extending from both sides of said carrier board as shown in FIG. 1. The configuration of the circuit paths 11 and the location of the tubular members 13 is determined by the specific requirements, number of components leads, etc., of any specific application. Again, it is pointed out that the tubular members may be constructed from appropriate plating of nickel/tin, copper or gold/copper and are not limited to nickel as described herein.

While not specifically set forth above, required cleaning and/or rinsing steps where appropriate are included in the process.

The thickness of the positioner board, the number of internal circuits within the board, and the tubular member length and diameter are modifications within the scope of this invention and can readily be accomplished by modifying the illustrated manner of carrying out the invention. For example, several layers of circuits can be made by adding combinations of epoxy-glass sheets 26 and 29 bonded together by appropriate layers of prepreg sheets with the internal circuits 11 positioned as desired.

It has thus been shown that the present invention provides a method of manufacturing media for attaching electronic components on both sides of multilayer circuits having the following advantages: (1) regardless of component lead material, the welder electrodes are always in contact with the same type of material, i.e., the material of which the tubular members are constructed, thus reducing sharply the number of variations in weld schedules for a given system; (2) the tubular members are self-aligning with respect to the component leads, eliminating the location and slippage problems which occur when welding round leads to flat ribbon or circuit tabs, and reducing considerably the labor or assembly time; (3) pre-established interconnect circuitry eliminates the possibility of operator-caused wiring errors; (4) the length and diameter of the tubular member can be readily varied; and (5) tubular member welding gives greater reliability by providing two welds inside each wall, instead of the single tangential weld obtained with other interconnect systems.

While specific types of materials and thicknesses have been set forth hereinbefore, it is understood that other materials and thicknesses which fulfill the requirements may be utilized.

What I claim is:

1. A method of manufacturing multitube electronic circuit boards of the type having an integral positioner board, at least one circuit path within the positioner board, and at least one tubular connector member extending from opposite sides of the positioner board comprising the steps of: positioning a first layer of epoxy-glass insulation material, having at least one side thereof clad with copper, on a first sheet of separator material with the copper side down; placing a first layer of epoxy-glass prepreg thereon; positioning a first layer of aluminum on the first layer of epoxy-glass prepreg, said first layer of aluminum having the same thickness as the extending height of the desired tubular member; placing second and third layers of epoxy-glass prepreg on the first aluminum layer; laying a second layer of epoxy-glass insulation material, having at least one side thereof clad with copper and defining a desired circuit path, on the third layer of epoxy-glass prepreg; placing fourth and fifth layers of epoxy-glass prepreg on the second layer of copper clad insulation material; positioning a second layer of aluminum on the fifth layer of epoxy-glass prepreg; laying a sixth layer of epoxy-glass prepreg on the second layer of aluminum; placing a third layer of epoxy-glass insulation material, having at least one side thereof clad with copper, on the sixth layer of epoxy-glass prepreg with the copper side up; positioning a second sheet of separator material on the copper clad side of the third layer of epoxy-glass insulation material; bonding together the assembled layers to produce a bonded laminate structure; forming apertures through the thus bonded laminate structure at the locations of the desired tubular members, the apertures having a size larger than the inside diameter of the desired tubular members; forming the desired tubular members with the apertures by plating techniques such that the tubular members are molecularly integral with at least a portion of the circuitry within the laminate structure, and removing all material from the laminate structure on each side thereof down to and including dissolving the two aluminum layers such that the thus formed tubular members extend from opposite sides of the remaining laminate structure.

2. The method defined in claim 1, additionally including placing a fourth layer of copper clad epoxy-glass insulation material having a desired circuit path thereon intermediate the fifth layer of epoxy-glass prepreg and the second layer of aluminum, and positioning seventh and eighth layers of epoxy-glass prepreg intermediate the fourth layer of copper clad insulation material and the adjacent second layer of aluminum.

3. The method defined in claim 1, wherein the step of bonding is accomplished by positioning the laminate structure in a heated pressing apparatus for a predetermined sequence of time and pressure settings, cooling the laminate structure under pressure to a predetermined temperature, and removing the bonded laminate structure from the pressing apparatus.

4. The method defined in claim 3, additionally including the step of trimming the laminate structure after removing same from the pressing apparatus.

References Cited

UNITED STATES PATENTS

| | | | |
|---|---|---|---|
| 3,311,966 | 4/1967 | Shakeen et al. | 29—530 XR |
| 3,340,607 | 9/1967 | Shutt | 29—625 |
| 3,370,351 | 2/1968 | Freehauf et al. | |
| 3,311,966 | 4/1967 | Shaheen et al. | 29—530 XR |

CHARLIE T. MOON, Primary Examiner

R. W. CHURCH, Assistant Examiner

U.S. Cl. X.R.

29—625, 626, 25.42, 530, 423; 117—212; 156—3; 174—68.5; 204—24, 25, 27; 317—101, 258; 339—17